US006540467B1

(12) United States Patent
Zohni et al.

(10) Patent No.: US 6,540,467 B1
(45) Date of Patent: Apr. 1, 2003

(54) APPARATUS AND METHOD OF SEMICONDUCTOR WAFER PROTECTION

(75) Inventors: Nael O. Zohni, Newark, CA (US); Clifford Fishley, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 23 days.

(21) Appl. No.: 09/884,006

(22) Filed: Jun. 18, 2001

(51) Int. Cl.[7] .................................................. B65D 1/34
(52) U.S. Cl. ....................... 414/275; 414/810; 414/940; 206/710
(58) Field of Search ................... 414/935, 800, 414/275, 937; 422/113, 243; 220/601, 661; 206/710, 711

(56) References Cited

U.S. PATENT DOCUMENTS

| 4,129,211 A | * | 12/1978 | Clement et al. | ......... 206/213.1 |
| 4,668,484 A | * | 5/1987 | Elliott | ......... 422/113 |
| 5,377,476 A | * | 1/1995 | Bohmer et al. | ......... 53/255 |
| 5,713,711 A | * | 2/1998 | McKenna et al. | ......... 414/217 |
| 5,810,537 A | * | 9/1998 | Briner et al. | ......... 414/217 |

\* cited by examiner

*Primary Examiner*—Eileen D. Lillis
*Assistant Examiner*—Charles A. Fox
(74) *Attorney, Agent, or Firm*—Conley, Rose & Tayon

(57) ABSTRACT

A system and a method are provided for preventing damage to wafers arranged in a wafer cassette. In particular, an apparatus is provided to protect wafers arranged in a wafer cassette during insertion of a wafer into the cassette. In one embodiment, the apparatus may be a separate entity from the wafer cassette. In this manner, the apparatus may be situated about the cassette such that the wafers arranged in the cassette are protected during insertion of a wafer. In another embodiment, the wafer cassette itself may be adapted to partially cover and protect the wafers arranged in the cassette during insertion of a wafer. Consequently, a method is provided using either embodiment of the apparatus. In particular, the method may include inserting a wafer into a wafer cassette by shielding one or more slots of the cassette, exposing a designated slot of the cassette, and inserting a wafer into the designated slot.

13 Claims, 5 Drawing Sheets

APPARATUS AND METHOD OF SEMICONDUCTOR WAFER PROTECTION

BACKGROUND OF THE INVENTION

1. Field of the Invention

This invention relates to semiconductor wafer handling apparatuses and methods, and more particularly to the use of an apparatus to prevent damage to wafers.

2. Description of the Related Art

The following descriptions and examples are not admitted to be prior art by virtue of their inclusion within this section.

During the fabrication of semiconductor devices, semiconductor wafers may be subjected to several processes. Such processes may include, but are not limited to, anneals, depositions, diffusions, thermal oxidations, ion implantations, and etches. Generally, these processes are performed sequentially and therefore, the cycle time of a finished device may be quite lengthy. For example, the cycle time for fabricating some devices may be several days or weeks. As such, mass production methods may be required to meet production needs. Consequently, batch-production techniques may be incorporated into semiconductor fabrication processes in order to simultaneously process multiple wafers. In addition to increasing production, the used of batch production methods may include an improved economy of scale. In particular, a reduction in per unit cost may be realized through increased operational efficiencies.

Another advantage of incorporating batch production techniques is the ability to more closely monitor quality and process control parameters. The increased number of wafers processed may offer valuable information regarding the process variables and/or equipment. As such, periodic inspections of the wafers may be performed between one or more of the fabrication steps. These inspections may be used as a means of monitoring quality control, which is essential for maintaining high manufacturing yields in fabrication. For example, the inspections may be helpful in identifying defects or determining if design specifications have been met. Consequently, equipment and/or processing parameters may be adjusted in response to the inspection results in order to reduce the occurrence of defects and/or meet design specifications of the device.

In a batch production process, multiple wafers may be processed through a series of fabrication steps without interruption. Alternatively, the wafers may be stored between fabrication steps until inspection or further processing is necessary. In either case, the wafers may be transported and/or stored in wafer cassettes or wafer carriers (hereafter called "wafer cassettes"). In general, wafer cassettes are any supporting structure used to contain or transport wafers or substrates. Wafer cassettes usually consist of an array of narrow slots that are closely situated. Each slot is generally designed to contain a single wafer. In addition, a portion of each slot may provide access for loading and unloading wafers. In some cases, wafer cassettes may be designed to load and unload wafers either horizontally or vertically. Such load and unload operations may be necessary for periodic inspections as discussed above.

As with many wafer handling processes, however, unloading and loading wafers into cassettes may cause damage to the wafers. Such damage may render one or more devices upon a wafer unusable, thereby reducing production yield and increasing manufacturing cost. One substantial cause of wafer damage stems from the insertion of wafers into the narrow slots of the cassette. Due to several factors, including the thinness of the wafers and the close proximity of the slots, it is likely that a wafer may be incorrectly inserted into the cassette. For example, a wafer could be inadvertently placed into an occupied slot. The placement of a wafer into an occupied slot may likely cause damage to both the wafer being inserted and to the wafer residing in the slot. It would, therefore, be desirable to develop a system and method to prevent damage to wafers while inserting a wafer into a cassette.

SUMMARY OF THE INVENTION

The problems outlined above are in large part addressed by a system and method for preventing damage to wafers arranged in a wafer cassette. In particular, an apparatus is provided to protect wafers arranged in a wafer cassette during insertion of a wafer into the cassette. In one embodiment, the apparatus may be a separate entity from the wafer cassette. In this manner, the apparatus may be situated about the cassette such that the wafers arranged in the cassette are protected during insertion of a wafer. In one embodiment, the apparatus may be an attachable component of the wafer cassette. As such, the apparatus may be adapted to fit on various configurations of wafer cassettes. In another embodiment, the wafer cassette itself may be adapted to at least partially cover and protect the wafers arranged in the cassette during insertion of a wafer. Consequently, a method is provided using either embodiment of the apparatus. In particular, the method may include inserting a wafer into a wafer cassette by shielding one or more slots of the cassette, exposing a designated slot of the cassette, and inserting a wafer into the designated slot.

The apparatus may be further adapted to ensure the wafer is placed into a designated slot in the cassette. In one embodiment, such a placement may be achieved by using a shield with an opening that exposes the designated slot. Consequently, the apparatus may include a shield with an opening that partially covers the wafers and exposes the designated slot prior to inserting the wafer into the cassette. Preferably, the shield spans at least three consecutive wafer slots of the cassette. In some embodiments, the opening in the shield may be tapered such that a portion of a wafer slot adjacent to the designated slot may be exposed prior to inserting the wafer into the cassette. Furthermore, the opening may be fixed within the shield. In such an embodiment, the apparatus may be adapted to allow movement of the shield across a length of the cassette. In addition or alternatively, the apparatus may be adapted to allow movement of the shield across a width of the cassette. In another embodiment, the shield may be fixed within the apparatus. Consequently, the shield may be adapted to allow movement of the opening across the length of the cassette.

In an alternative embodiment, the apparatus may include multiple shields. In particular, each of the shields may be adapted to cover a respective single slot of the cassette. In some cases, the apparatus may be adapted to displace a shield covering a designated slot prior to inserting the wafer into the cassette. In this manner, the apparatus may be adapted to allow movement of the shields across a length of the cassette. In addition or alternatively, the apparatus may be adapted to allow movement of the shields across a width of the cassette. In some embodiments, the apparatus may further include a frame adapted to maintain the shields in close proximity to the wafer slots. For example, the shields may attach to the frame. In other embodiments, the frame may be adapted to allow the shields to move within the frame. More specifically, the frame may be adapted to allow the shields to move across the width and/or the length of the apparatus.

In an alternative embodiment, the apparatus as described herein may include a wafer cassette adapted to at least partially cover and protect wafers arranged in the cassette during insertion of a wafer. Such a cassette may include one or more shields. In such an embodiment, the wafer cassette itself may prevent damage to wafers arranged within the cassette during the insertion of a wafer in a similar manner as described for the apparatus mentioned above. As such, the cassette may be adapted to prevent a wafer from being inserted into occupied wafer slots of the cassette. The cassette may further include a frame adapted to maintain one or more of the shields in close proximity of an array of wafer slots within the cassette. In some embodiments, the frame and shields may be a fixed portion of the cassette. Alternatively, the frame and/or shields may be detachable components of the cassette. In addition, the shields may span at least three consecutive wafer slots and provide an opening that partially covers the wafers and exposes a designated slot of the cassette prior to inserting a wafer. Alternatively, each of the shields may be adapted to cover a respective single slot of the cassette. In some embodiments, the wafer cassette may include a mechanism that positions the shields over the slots. Such a system may allow a designated slot of the cassette to be exposed. For example, in an embodiment in which the cassette includes a shield with an opening, the frame may be adapted to orientate the shield such that the opening is over the designated slot. Alternatively, in an embodiment in which the cassette includes multiple shields adapted to cover a respective single slot, the frame may be adapted to allow displacement of the shields to expose the designated slot.

A method for inserting a wafer into a wafer cassette is also contemplated herein. Such a method may include shielding one or more slots of a cassette, exposing a designated slot absent the shielding, and inserting a wafer into the designated slot. Shielding the slots may include placing a shield with an opening over the slots. In such an embodiment, exposing may include positioning the opening over a designated slot, thereby covering the slots adjacent to the designated slot. Alternatively, shielding may include placing multiple shields, each over respective single slots of the cassette. Consequently, exposing may include displacing a shield placed over the designated slot of the cassette.

Several advantages may be realized from the devices and methods contemplated herein. For example, shielding a wafer from being inserted into an occupied wafer slot may prevent damage to both the wafer in the slot and the wafer being inserted. Consequently, the likelihood of damaging wafers may be reduced and an increase in production yield and a decrease in fabrications costs may be realized. In addition, the apparatuses and methods as described herein may allow a wafer to placed into a designated slot a faster rate since an opening in the shield may guide the placement of a wafer into the designated slot. As such, less time may be needed to load and unload a wafer cassette, thereby reducing the time to process the wafers.

BRIEF DESCRIPTION OF THE DRAWINGS

Other objects and advantages of the invention will become apparent upon reading the following detailed description and upon reference to the accompanying drawings in which.

Figure 1:
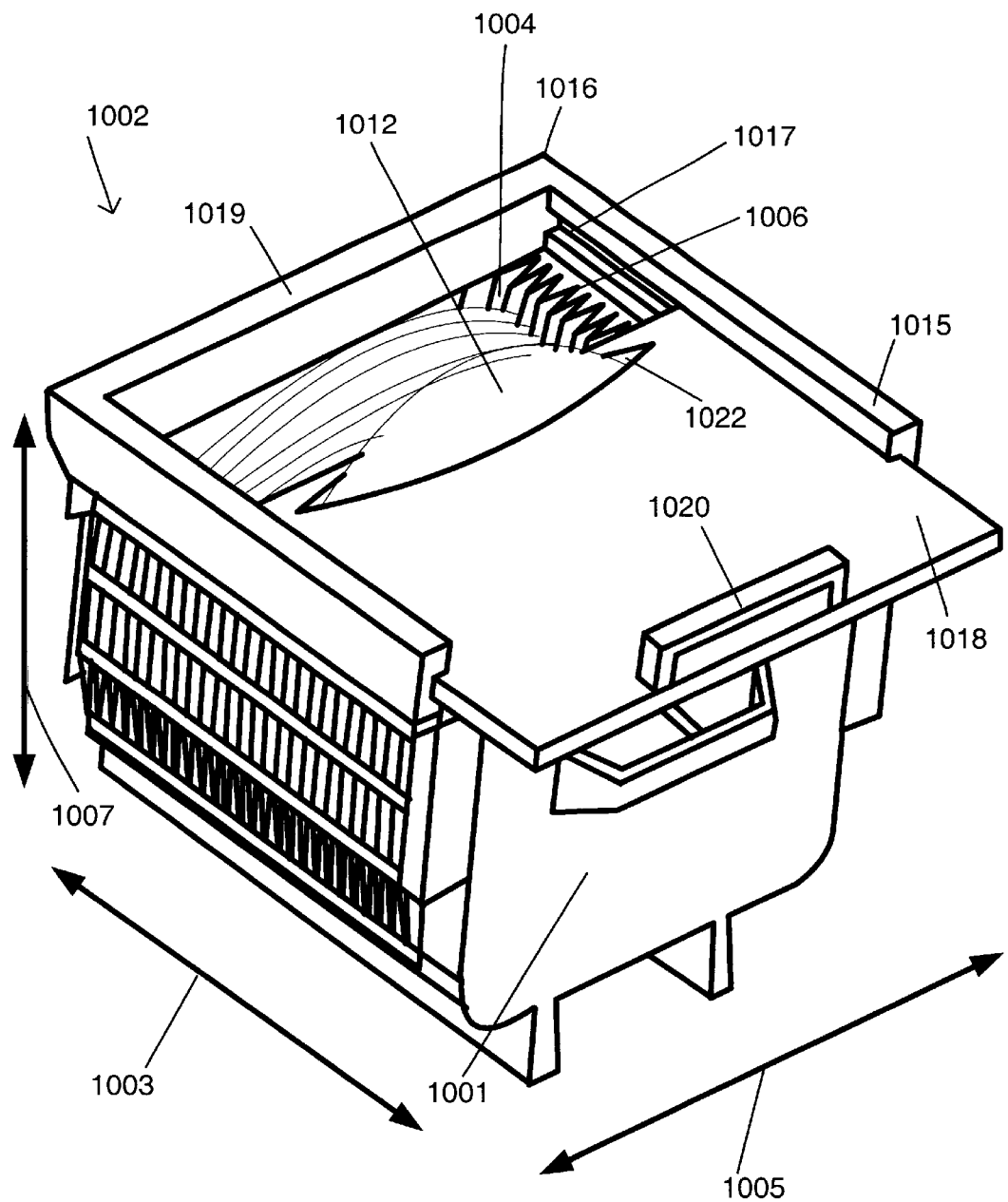
FIG. 1 depicts a perspective view of an apparatus that includes a movable shield with a fixed opening.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
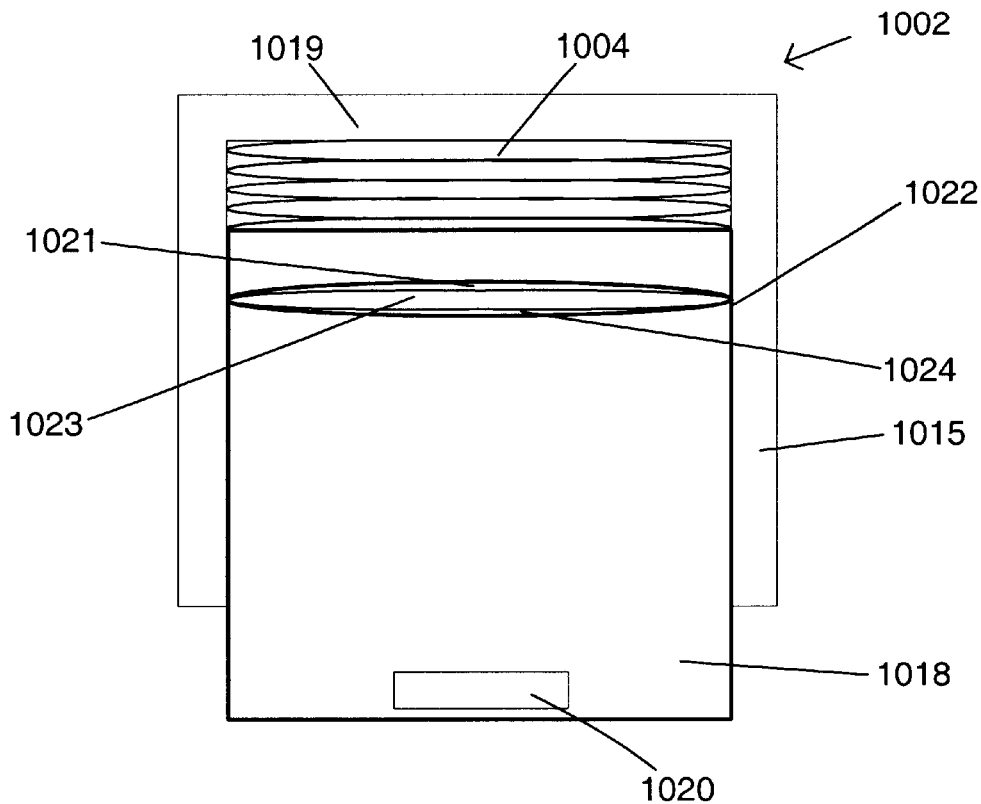
FIG. 2 depicts a top-view of the apparatus of FIG. 1.
Figure 3:
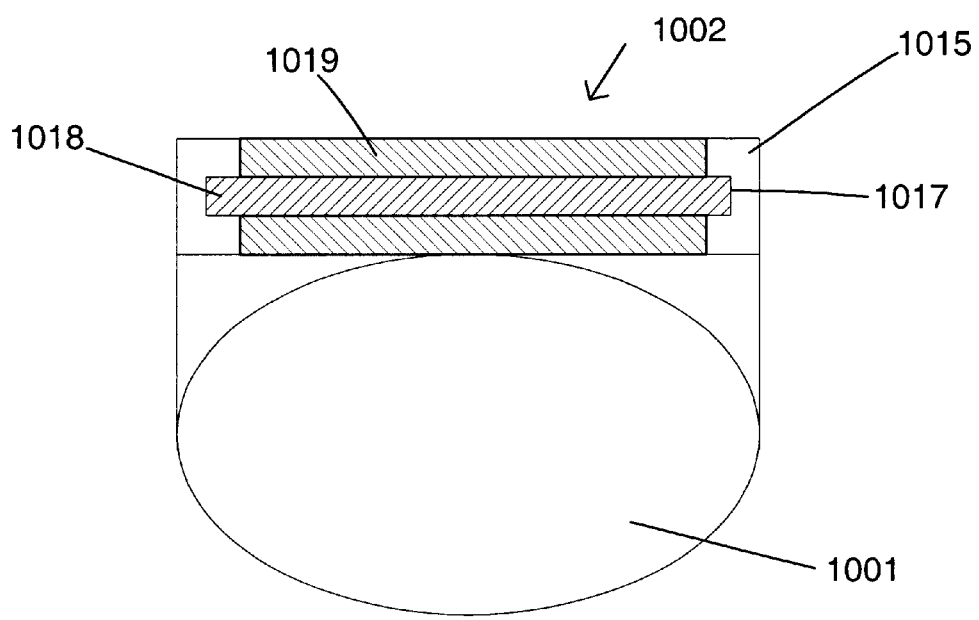
FIG. 3 depicts a partial front cross-section view of the apparatus of FIG. 1.

Turning to the drawings, exemplary embodiments of devices adapted to at least partially cover and protect wafers arranged in a wafer cassette are shown. For example, FIGS. 1–3 illustrate different views of wafer cassette 1002. In particular, FIG. 1 depicts a perspective view of wafer cassette 1002, while FIGS. 2 and 3 illustrate a top view and side view of wafer cassette 1002, respectively. Wafer cassette 1002 may be adapted to partially cover and protect wafers 1012 arranged in the cassette during insertion of wafer 1012. Moreover, wafer cassette 1002 may be adapted to prevent wafer 1012 from being inserted into occupied wafer slots of the cassette. Wafer cassette may be further adapted to ensure wafer 1012 is placed into a designated slot in the cassette.

Wafer cassette 1002 may be either a wafer carrier or a wafer cassette. In general, wafer carriers and wafer cassettes may be any supporting structure used to store and/or transport substrates or wafers during processing. More specifically, a wafer carrier may be any supporting structure used to contain and/or transfer one or more wafers. Conversely, a wafer cassette may be any supporting structure that holds and/or transports one or more substrates. A wafer may be generally referred to as a thin slice of semiconductor material from which one or more semiconductor devices or circuits are made. A substrate, on the other hand, may be the underlying material upon which a semiconductor device or circuit is fabricated. However, for purposes of the method and systems as described herein, the definitions of a wafer and a substrate may be used interchangeably hereinafter. As such, the term "wafer cassette" will reference any such wafer cassette, wafer carrier, or device used to store or transport one or more wafers or substrates. Consequently, wafer cassette 1002 of FIG. 1 may include any supporting structure used for storing and/or transporting substrates or wafers. Furthermore, wafer cassette 1002 may be a stationary or transportable device. Wafer cassette 1002 may be polypropylene, quartz, or any other material compatible for the storage of semiconductor wafers.

As shown in FIG. 1, wafer cassette 1002 may be a vertically-loaded cassette, i.e. wafer cassette 1002 may be designed to allow wafers 1012 to be loaded in a manner that wafers 1012 are perpendicular to the base of the cassette. In an alternative embodiment, wafer cassette 1002 may be a horizontally-loaded cassette. As such, wafer cassette 1002 may be designed to allow wafers 1012 to be loaded in a manner that the wafers are parallel to the base of the cassette. The dimensions of wafer cassette 1002 may include length 1003, width 1005, and height 1007. In general, width 1005 and height 1007 may depend on the size of wafers 1012 while length 1003 may depend on the number of wafers the cassette is capable of holding. Wafers sizes vary, but sizes currently used in the semiconductor fabrication industry are 200-mm and 300-mm diameter wafers. As such, width 1005 and height 1007 may be slightly larger than approximately 200 mm or approximately 300 mm depending on what size wafer the cassette is designed to hold. Alternatively, width 1005 and height 1007 may also depend on other dimensional features of wafer cassette 1002. For example, the dimensions of width 1005 and height 1007 may depend on sidewall thickness and/or base support dimensions.

As stated above, length 1003 of wafer cassette 1002 may depend on the number of wafers the cassette is capable of holding. Wafer cassette 1002 preferably includes slots 1004 for holding wafers 1012. An array of slots may be referred to as a slot group and may extend along all or a portion of length 1003 of wafer cassette 1002. The number of slots in an array can vary, but is generally about 25 wafers for wafer cassettes that carry 200-mm wafers and generally about 10 wafers for wafer cassettes that carry 300-mm wafers. Each cassette slot is preferably designed to contain a single wafer. As such, the size of each of slots 1004 may be slightly larger than the size of a wafer. More specifically, the width of slots 1004 may be approximately 2 mm or approximately 3 mm larger than the diameter of wafers which 1010. Larger and smaller slot widths, however, may be appropriate depending on the design specifications of the wafer cassette. In addition, the pitch of slots 1004 may be approximately 1.5 times to approximately 2.0 times greater than the width of wafers 1012. Pitch, also referred to as slot spacing, may be the distance from the centerline of one slot to the centerline of an adjacent slot. In an embodiment, the pitch of slots 1004 may be between approximately 2.0 mm and approximately 4.0 mm. However, larger or smaller pitch dimensions may be used depending on the design specifications of the wafer cassette. In some embodiments, slots 1004 may include tapered edge 1006 to more clearly outline the distinction of each individual slot.

In a preferred embodiment, the wafer cassette as described herein may include one or more shields. In the embodiment of FIGS. 1–3, wafer cassette 1002 includes single shield 1018. Shield 1018 may include the same material as wafer cassette 1002, but any material sufficient to protect wafers 1012 may be used. As shown in FIG. 2, shield 1018 may include opening 1022 for exposing designated slot 1023 of wafer cassette 1002. Consequently, the occupancy of designated slot 1023 may be determined. Designated slot 1023 may be any one of slots 1004 selected for insertion of wafer 1012. FIGS. 1 and 2 illustrate designated slot 1023 to be approximately in the middle of wafer cassette 1002. However, the selection of designated slot 1023 may vary within wafer cassette 1002. In the embodiment of FIG. 1, opening 1022 may be fixed within shield 1018. In this manner, wafer cassette 1002 may be adapted to allow movement of shield 1018 to position opening 1022 over a designated slot. Such movement may be across the length and/or width of wafer cassette 1002.

The dimensions of opening 1022 may vary depending on the design specifications of the wafer cassette. In some embodiments, opening 1022 may have similar dimensions to that of the underlying designated slot. Alternatively, opening 1022 may be tapered across the width of shield 1018. For example, the edges of opening 1022 may be tapered. For example, the edges of opening 1022 may be tapered to the same degree as tapered edge 1006 of slots 1004 as shown in FIG. 2. Conversely, the edges of opening 1022 may not be tapered. In addition or alternatively, opening 1022 may be tapered such that a portion of wafer slot 1021 and/or a portion of wafer slot 1024 adjacent to designated slot 1023 may be exposed as shown in FIG. 2. The exposure of such portions of wafer slot 1021 and/or wafer slot 1024 may allow designated slot 1023 to be more accessible while still preventing wafer 1012 from being inserted into adjacent slots 1021 and 1024. As such, wafers residing in slots 1021 and 1024 may be protected during the insertion of wafer 1012 in addition to any wafers residing in the other wafer slots of wafer cassette 1002.

Insertion of wafer 1012 in designated slot 1023 may be achieved by several methods. For example, a clamping tool designed to grasp wafers at their edges may be used. Another method of insertion may be by use a forefinger and a thumb. In some cases, it may be advantageous to design opening 1022 to be large enough to accommodate the width of a clamping tool or a couple of fingers while still preventing the insertion of a wafer into adjacent slots. A large enough opening may provide additional clearance around designated slot 1023 such that a wafer may be inserted with less precision than inserting a wafer in an opening that is approximately the same size as an underlying designated slot. Regardless of size and shape, opening 1022 is preferably designed not to be a source of potential damage to wafer 1012 or wafers 1012.

In order to more easily position opening 1022 over designated slot 1023, shield 1018 may also include handle 1020. As shown in FIGS. 1 and 2, handle 1020 may be arranged near an edge of shield 1018. However, handle 1020 may be positioned along any portion of shield 1018 such that it does not hinder access to designated slot 1023 through opening 1022. FIGS. 1 and 2 show shield 1018 extending beyond the front-lateral surface of wafer cassette 1002. In addition, the length of shield 1018 is shown as being appreciably longer than the length of opening 1022. However, the length of shield 1018 may be shorter or longer depending on the design specifications of the shield and/or wafer cassette. For example, in one embodiment, the length of shield 1018 may be only slightly larger than the length of opening 1022. More specifically, the length of shield 1018 may be reduced to a length that spans at least three consecutive wafer slots of the cassette. In such an embodiment, the shorter length of shield 1018 may allow multiple shields to be placed over slots 1004. In this manner, a plurality of slot may be designated for the insertion and removal of wafers. As such, wafer cassette 1002 may include, in some embodiments, multiple shields.

Figure 7:
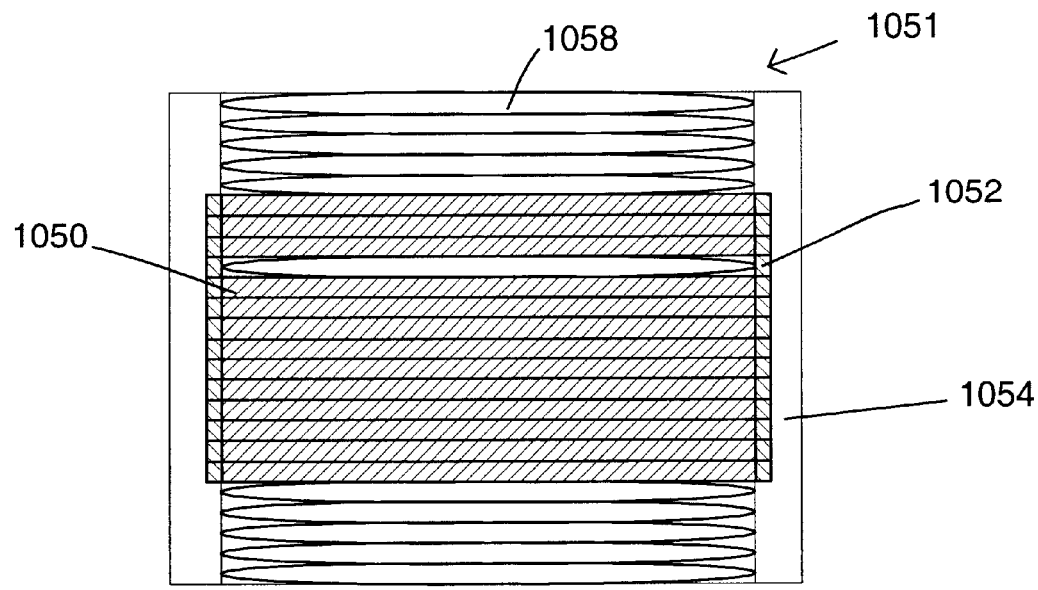
FIG. 7 depicts a top view of an apparatus, in an alternative embodiment, which includes multiple single-slot shields clamped above an array of wafer slots.

In addition, wafer cassette 1002 may include frame 1016. Frame 1016 may be adapted to maintain shield 1018 in close proximity to slots 1004 of wafer cassette 1002. More specifically, frame 1016 may be adapted to maintain shield 1018 close enough to slots 1004 such that wafer 1012 may be placed into designated slot 1023 without disturbing wafers placed in slots adjacent to designated slot 1023. In an embodiment, shield 1018 may fit into track 1017 of frame 1016 as shown in FIGS. 1 and 3. Consequently, shield 1018 may move through frame 1016 along length 1003 of wafer cassette 1002. In addition or alternatively, frame 1016 may be adapted to allow shield 1018 to move along width 1005 of wafer cassette 1002. Such an embodiment is described and illustrated in FIGS. 4 and 5. In another embodiment, frame 1016 may be adapted to attach shield 1018 on top of frame 1016 as shown in FIG. 7. Alternatively, frame 1016 may be omitted from wafer cassette 1002. In such an embodiment, wafer cassette 1002 may be adapted such that one or more shields may be arranged over slots 1004.

Frame 1016 may be either a separate entity from wafer cassette 1002 or may be a molded part of wafer cassette 1002. For example, a portion or all of frame 1016 may be molded with wafer cassette 1002. Alternatively, frame 1016 may be a detachable component of wafer cassette 1002. In either embodiment, frame 1016 may include the same material as wafer cassette 1002. Alternatively, frame 1016 may include any material that may sufficiently support shield 1018. Frame 1016 may include frame back 1019 and frame-sides 1015. In particular, frame-back 1019 and frame-sides 1015 may be arranged along the upper edges of wafer cassette 1002. More specifically, frame-back 1019 may be arranged along width 1005 and frame-sides 1015 may be arranged along length 1003 of wafer cassette 1002. In some cases, frame-back 1019 may be used to restrict the movement of shield 1018. In such an embodiment, opening 1022 may have to be strategically arranged along the length of shield 1018 such that each of slots 1004 may be accessed. In addition or alternatively, shield 1018 may adapted to be removed from the apparatus and placed back in the opposite direction such that handle 1020 is near frame-back 1019. Such an embodiment lessens the restriction of the arrangement of opening 1022 along the length of shield 1018. Alternatively, frame-back 1019 may have an opening large enough so that shield 1018 may be allowed to traverse through the opening to the opposite side of frame-back 1019. In yet another embodiment, frame 1016 may not include frame-back 1019. In either of the latter embodiments, the arrangement of opening 1022 along the length of shield 1018 may not be as significant as in the embodiment which includes frame-back 1019 without an opening.

In an alternative embodiment, the apparatus of FIGS. 1–3 may illustrate shielding apparatus 1014 attached to wafer cassette body 1001 instead of a wafer cassette as a whole. In such an embodiment, wafer cassette body 1001 may be any supporting structure used to store and/or transport wafers. Shielding apparatus 1014, on the other hand, may be the part of the apparatus that is adapted to partially cover and protect wafers arranged in wafer cassette body 1001 during insertion of wafer 1012 into the cassette. Moreover, shielding apparatus 1014 may be adapted to ensure that wafer 1012 is placed into designated slot 1023 of cassette body 1001. Shielding apparatus 1014 may include frame 1016 and shield 1018 and may be a separate entity from wafer cassette body 1001. In this manner, all components of shielding apparatus 1014 may be detachable components of wafer cassette 1002.

FIGS. 4–8 illustrate top, front, and/or cross-sectional views of various embodiments of wafer cassettes and/or shielding apparatuses. Although the following descriptions for FIGS. 4–8 discuss different embodiments of shielding apparatuses, such references may be interchangeably used for embodiments of wafer cassettes adapted to partially cover and protect wafers arranged in the cassettes during the insertion of wafers. As such, each of the embodiments of FIGS. 4–8 may refer to as a wafer cassette adapted to partially cover and protect wafers in the cassette during the insertion of a wafer in addition to a shielding apparatus adapted for the same purpose. It is noted that the corresponding perspective views of the embodiments of FIGS. 4–8 may be similar to that of FIG. 1 with appropriate modifications made to the shield and frame in order to reflect the corresponding top, front, and/or cross-sectional views of the embodiments of FIGS. 4–8.

Figure 4:
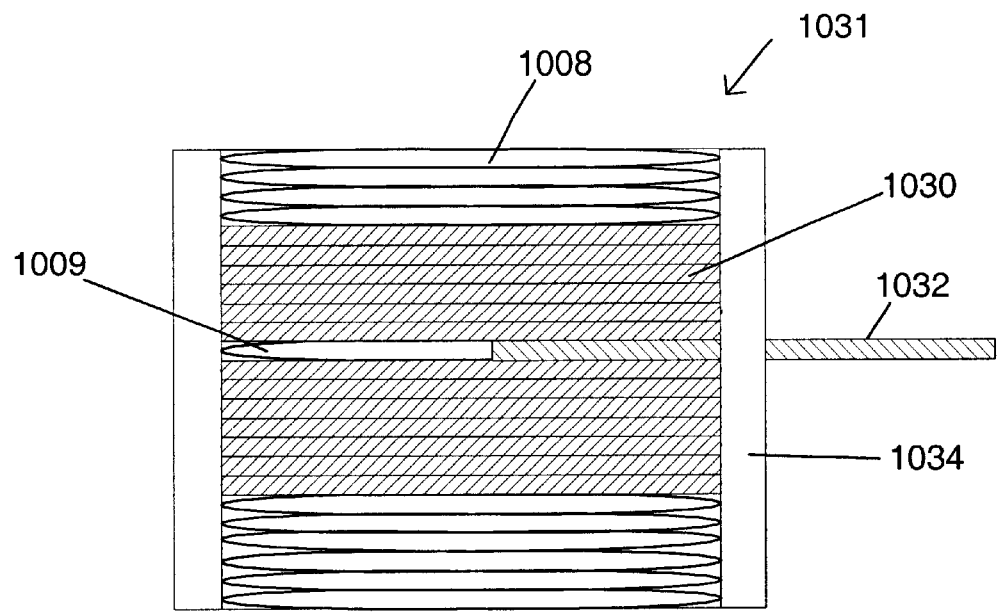
FIG. 4 depicts a partial top-view of an apparatus, in an alternative embodiment, which includes multiple single-slot shields arranged in a frame.

FIG. 4 illustrates an alternative embodiment of a shielding apparatus including several single-slot shields, each of which may respectively cover a single cassette slot. In particular, shielding apparatus 1031 includes single-slot shields 1030 which may cover slots 1008 of an underlying wafer cassette. In addition, shielding apparatus 1031 may also include frame 1034. Frame 1034 may include frame-sides arranged along the length of the underlying wafer cassette. Alternatively, frame 1034 may include both frame-sides and a frame-back similar to the embodiment illustrated in FIG. 1. In one embodiment, shielding apparatus 1031 may be adapted such that single-slot shields 1030 may move through frame 1034. In particular, shielding apparatus 1031 may be adapted to allow shields 1030 to move along the length of the underlying wafer cassette. In addition or alternatively, shielding apparatus 1031 may be adapted to allow shields 1030 to move across a width of the underlying wafer cassette. Designated-slot shield 1032 may be displaced in such a manner that slot 1009 is exposed. In an embodiment in which slots immediately adjacent to slot 1009 are covered and slot 1009 is uncovered, a wafer may be safely be inserted into designated slot 1009. As such, shielding apparatus 1031 is adapted to partially cover and protect the wafers in arranged in the underlying cassette during the insertion of a wafer into slot 1009. Furthermore, shielding apparatus 1031 is adapted to prevent a wafer from being inserted into occupied wafer slots of the cassette.

FIG. 4 illustrates designated-slot shield 1032 extending outside the lateral edge of shielding apparatus 1031. As with the shield 1018 of FIG. 1, single-slot shields 1030 may be made of the same material as wafer cassette 1022, or any other material sufficient to shield wafers arranged in an underlying wafer cassette. In some cases, single-slot shields 1030 may include a material rigid enough such that designated-slot shield 1032 may extend parallel to the base of the underlying wafer cassette when moved outside the lateral edge of shielding apparatus 1031. Alternatively, single-slot shields 1030 may include a material flexible enough such that designated-slot shield 1032 hangs down along the side of the underlying wafer cassette when moved outside the lateral edge of shielding apparatus 1031.

Figure 5:
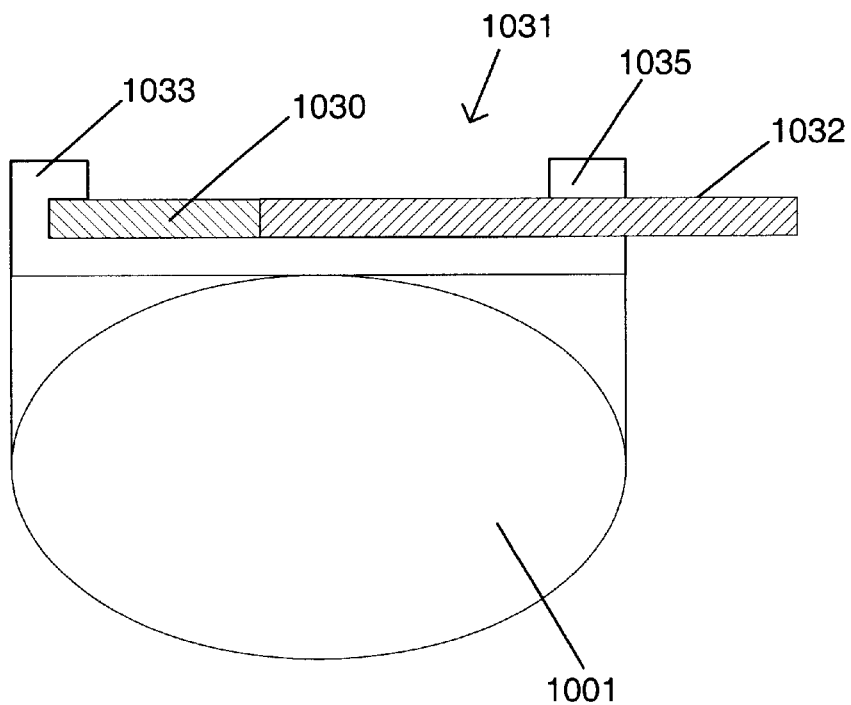
FIG. 5 depicts a partial cross-section view of the apparatus of FIG. 4.

FIG. 5 is a cross-sectional view of shielding apparatus 1031 arranged upon wafer cassette body 1001. In particular, the view of FIG. 5 is a cross-section of shielding apparatus 1031 cut along designated-slot shield 1032. FIG. 5 depicts how single-slot shields 1030 may move through frame 1034 across the width of the underlying wafer cassette. More specifically, FIG. 5 illustrates a portion of designated-slot 1032 displaced outside the lateral edge of frame 1034. Shielding apparatus 1031 may be adapted to allow single-slot shields 1030 to slide through either side of frame 1034. In FIG. 5, frame-side component 1033 is adapted to restrict single-slot shields 1030 from passing through one side of shielding apparatus 1031 while frame-side component 1035 is adapted to allow single-slot shields 1030 to pass through the other side of shielding apparatus 1031. In an alternative embodiment, both frame side-components 1033 and 1035 may be adapted to allow single-slot shield 1030 to pass through the sides of shielding apparatus 1031.

Figure 6:
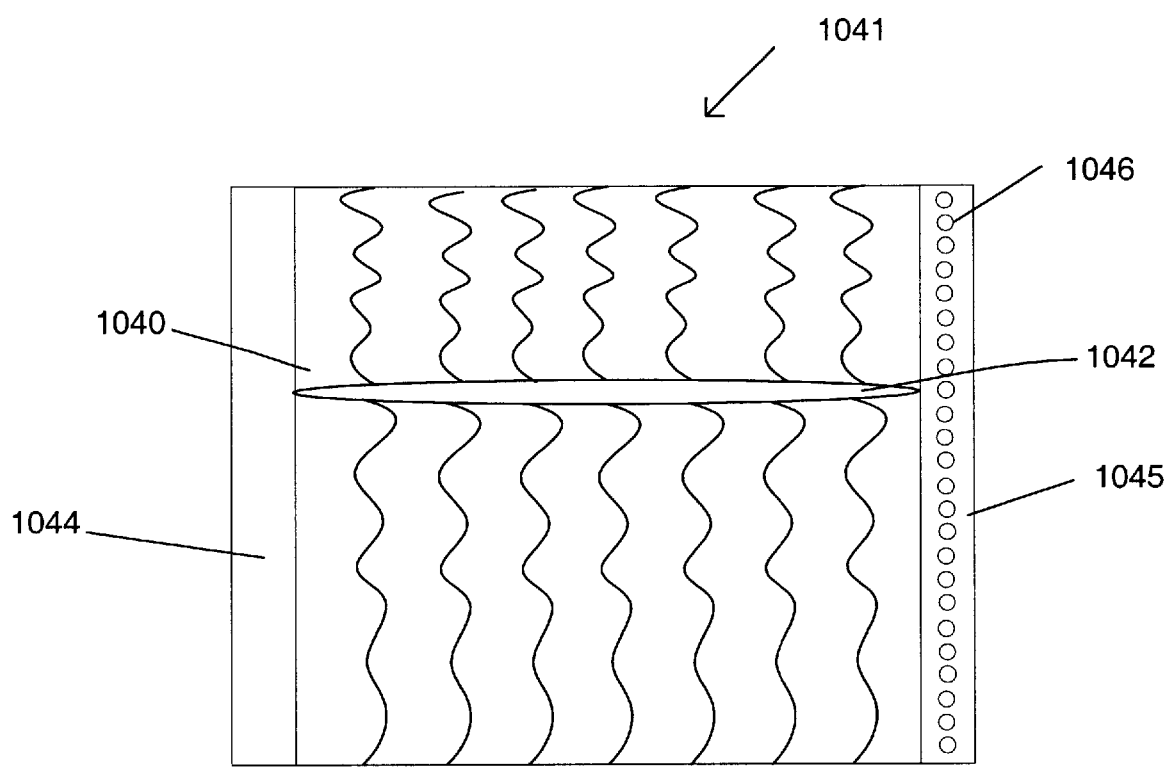
FIG. 6 depicts a partial top-view of an apparatus, in an alternative embodiment, which includes a fixed shield with a moveable opening.

FIG. 6 illustrates an alternative embodiment of a shielding apparatus including a single shield fixed along a length of a frame. In particular, shielding apparatus 1041 includes shield 1040 fixed along frame 1044. Frame 1044 may be adapted to maintain shield 1040 in close proximity to wafer slots of an underlying wafer cassette. In some embodiments, shield 1040 may extend along the entire length of frame 1044. In an alternative embodiment (not shown), shield 1040 may only span a portion of frame 1044. In this manner, shield 1040 may span at least three consecutive slots of an underlying wafer cassette. Shield 1040 may include opening 1042. Shield 1040 may include a material which may expand and contract such that opening 1042 may move across the length of the shielding apparatus. The front view of shielding apparatus 1041 may be similar to that of FIGS. 3 or 5.

In some cases, shielding apparatus 1041 may include a positioning mechanism to orient opening 1042 over a designated slot of an underlying wafer cassette. For example, such a positioning mechanism may include a series of LED lights 1046 positioned along the length of an underlying wafer cassette. In particular, the LED lights may be arranged in alignment with respective slots of the wafer cassette. In an embodiment that includes frame 1044, the series of LED lights may be positioned along one or both of frame-sides 1045. An LED light corresponding to a designated slot of an underlying wafer cassette may turn either on or off when opening 1042 is positioned over the designated slot. In another embodiment, the positioning mechanism may be an automated system (not shown) that positions opening 1042 over a designated slot of an underlying wafer cassette. The positioning of such automated system may be based on input entered into an electronic or mechanical interface. Another type of positioning mechanism may include a series of notches (not shown) within a track of frame 1044. Shield 1040 may fit into notches corresponding to a designated slot of the wafer cassette indicating the appropriate placement of opening 1042. Other positioning mechanisms, however, may be used and may include any system that aids in positioning one or more shields over an underlying wafer cassette.

FIG. 7 illustrates an alternative embodiment of a shielding apparatus, which includes multiple single-slot shields attached to a frame or attached directly to an underlying wafer cassette. In particular, shielding apparatus 1051 includes single-slot shields 1050, each of which may respectively cover one of slots 1058 of an underlying wafer cassette. Single-slot shields 1050 may be similar to single-slot shields 1030 in FIG. 4. More specifically, single-slot shields 1050 may have a similar composition and size as single-slot shields 1030. One of single-slot shields 1050 may be displaced from shielding apparatus 1051, thereby exposing a designated slot in an underlying wafer cassette. Preferably, the single-slot shields adjacent to the removed shield remain in position to protect any wafers that may be residing in their respective underlying wafer slots. The displacement of one of the single-slot shields 1050 may allow a wafer to be inserted into the designated slot while ensuring that the wafer is not placed into an occupied slot.

Figure 8:
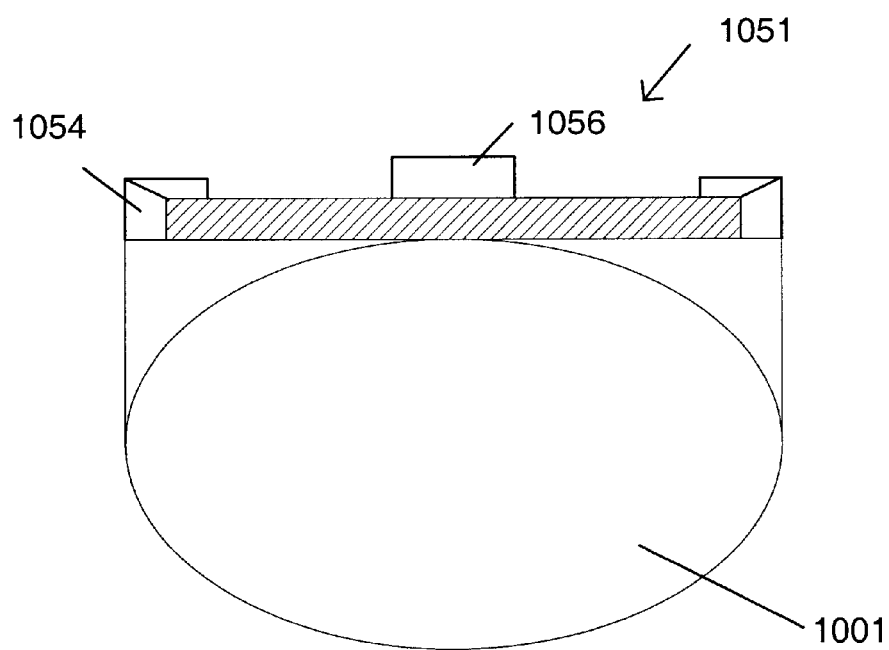
FIG. 8 depicts a partial front cross-section view of the apparatus of FIG. 7.

Single-slot shields 1050 may be directly attached to an underlying wafer cassette. Alternatively, single-slot shields 1050 may be clamped to frame 1054 as illustrated in FIG. 7. Frame 1054 may be similar to frame 1034 of FIG. 4. More specifically, frame 1054 may have a similar composition and size as frame 1034. Clamps 1052 may be used to attach single-slot shields 1030 to frame 1034 or an underlying wafer cassette. Alternatively, any type of device capable of attaching single-slot shields 1050 over respective slots 1058 may be used. Clamps 1052 may be arranged on one or both sides of shielding apparatus 1051. FIG. 8 illustrates a front view of shielding apparatus 1051, including clamps 1052 included on both sides of shielding apparatus 1051. In alternative embodiment, only one clamp may be used on one side of shielding apparatus 1051 and a hinge may be used in place of the other clamp. Such an embodiment may allow one of single-slot shields 1050 to be displaced, but remain in contact with shielding apparatus 1051. In addition, single-slot shields 1050 may have handle 1056 as shown in FIG. 8. Handle 1056 may be used to lift single-slot shields 1050 away from an underlying wafer slot more easily.

It will be appreciated to those skilled in the art having the benefit of this disclosure that this invention is believed to provide a method and a system for protecting wafers arranged in a wafer cassette during insertion of a wafer into the cassette. Further modifications and alternative embodiments of various aspects of the invention will be apparent to those skilled in the art in view of this description. For example, each of the embodiments discussed herein may be incorporated into a wafer cassette or a separate shielding apparatus. It is intended that the following claims be interpreted to embrace all such modifications and changes and, accordingly, the drawings and the specification are to be regarded in an illustrative rather than a restrictive sense.

What is claimed is:

1. An apparatus adapted to at least partially cover and protect wafers arranged in a wafer cassette during insertion of a wafer into a designated slot in the cassette, wherein a shield partially covers the wafer and comprises an opening within the shield to expose the designated slot prior to said insertion, and wherein the opening is tapered such that a portion of a wafer slot adjacent to the designated slot is exposed prior to said insertion.

2. The apparatus of claim 1, wherein the shield spans at least three consecutive wafer slots of the cassette.

3. The apparatus of claim 1, wherein said opening is fixed within the shield.

4. The apparatus of claim 1, wherein the apparatus is adapted to allow movement of the shield to move across a length of the cassette.

5. The apparatus of claim 1, wherein the apparatus is adapted to allow movement of the shield to move across a width of the cassette.

6. The apparatus of claim 1, wherein said shield is fixed within the apparatus, and wherein said shield is adapted to allow movement of the opening across a length of the cassette.

7. An apparatus adapted to at least partially cover and protect wafers arranged in a wafer cassette during insertion of a wafer into a designated slot in the cassettes, wherein the apparatus comprises multiple shields, wherein each of the shields is adapted to cover a respective single slot of the cassette, and wherein the apparatus is adapted to displace a shield covering the designated slot prior to said insertion of the wafer.

8. The apparatus of claim 7, further comprising a frame adapted to maintain the shields in close proximity to the wafer slots.

9. The apparatus of claim 7, wherein a frame is adapted to allow movement of the shields across a width of the apparatus.

10. The apparatus of claim 7, wherein a frame is adapted to allow movement of the shields across a length of the apparatus.

11. The apparatus of claim 9, further adapted to prevent the wafer from being inserted into occupied wafer slots of the cassette.

12. The apparatus of claim 10, further comprising a frame adapted to maintain the shield in close proximity to an array of wafer slots within the cassette.

13. A method for inserting a wafer into a wafer cassette, comprising:

shielding one or more slots of the cassette by placing multiple shields each over respective single slots and exposing a designated slot of the cassette absent said shields by displacing a single shield placed over the designated slot; and inserting the wafer into the designated slot.

\* \* \* \* \*